(12) United States Patent
Smith

(10) Patent No.: US 9,754,809 B2
(45) Date of Patent: Sep. 5, 2017

(54) TRI-MODAL CARRIER FOR A SEMICONDUCTIVE WAFER

(71) Applicant: Eryn Smith, Pleasanton, CA (US)

(72) Inventor: Eryn Smith, Pleasanton, CA (US)

(73) Assignee: WESTERN ALLIANCE BANK, San Jose, CA (US)

( * ) Notice: Subject to any disclaimer, the term of this patent is extended or adjusted under 35 U.S.C. 154(b) by 312 days.

(21) Appl. No.: 14/538,183

(22) Filed: Nov. 11, 2014

(65) Prior Publication Data

US 2015/0129121 A1    May 14, 2015

Related U.S. Application Data

(60) Provisional application No. 61/902,591, filed on Nov. 11, 2013.

(51) Int. Cl.
*H01L 21/683* (2006.01)
*H02N 13/00* (2006.01)

(52) U.S. Cl.
CPC ......... *H01L 21/6833* (2013.01); *H02N 13/00* (2013.01)

(58) Field of Classification Search
CPC ............................ H01L 21/6833; H02N 13/00
See application file for complete search history.

(56) References Cited

U.S. PATENT DOCUMENTS

| | | | | |
|---|---|---|---|---|
| 5,315,473 A * | 5/1994 | Collins | ............... | H01L 21/6833 361/233 |
| 5,737,178 A * | 4/1998 | Herchen | ............. | H01L 21/6831 118/401 |
| 5,812,361 A * | 9/1998 | Jones | .................. | H01L 21/6833 279/128 |
| 5,835,335 A * | 11/1998 | Ross | .................... | H01L 21/6831 279/128 |
| 5,953,200 A * | 9/1999 | Haley | ................. | H01L 21/6831 279/128 |
| 6,055,150 A * | 4/2000 | Clinton | ............... | H01L 21/6833 279/128 |
| 6,069,785 A * | 5/2000 | Ha | ....................... | H01L 21/6833 279/128 |
| 6,215,640 B1 * | 4/2001 | Hausmann | .......... | H01L 21/6833 361/115 |

(Continued)

*Primary Examiner* — Stephen W Jackson
*Assistant Examiner* — Christopher Clark

(57) ABSTRACT

A tri-modal carrier provides a structural platform to temporarily bond a semiconductive wafer and can be used to transport the semiconductive wafer or be used to perform manufacturing processes on the semiconductive wafer. The tri-modal carrier includes a doped semiconductive substrate, a plurality of electrostatic field generating (EFG) circuits, and a capacitance charging interface. A positive pole and a negative pole from each EFG circuit are embedded into the doped semiconductive substrate. An exposed portion of the doped semiconductive substrate is located between the positive pole and the negative pole, which is used as a biased pole for each EFG circuit. The combination of these poles for each EFG circuit is used to generate a non-uniform electrostatic field for bonding the semiconductive wafer. The tri-modal carrier also uses flat surface properties and the removal of trapped gas particles to strengthen the bond between the tri-modal carrier and the semiconductive wafer.

10 Claims, 5 Drawing Sheets

(56) References Cited

U.S. PATENT DOCUMENTS

| | | | | |
|---|---|---|---|---|
| 2001/0009497 A1* | 7/2001 | Takahasi | ............. | H01L 21/6833 |
| | | | | 361/234 |
| 2003/0053283 A1* | 3/2003 | Loo | ........................ | H02N 13/00 |
| | | | | 361/234 |
| 2004/0040665 A1* | 3/2004 | Mizuno | ............... | H01L 21/6833 |
| | | | | 156/345.51 |
| 2006/0002052 A1* | 1/2006 | Lagos | ..................... | H02N 13/00 |
| | | | | 361/234 |
| 2007/0297118 A1* | 12/2007 | Fujii | ...................... | H02N 13/00 |
| | | | | 361/234 |
| 2012/0134065 A1* | 5/2012 | Furuya | ................ | H01L 21/6833 |
| | | | | 361/234 |
| 2013/0114181 A1* | 5/2013 | Drewery | ............. | H01L 21/6833 |
| | | | | 361/234 |
| 2015/0043123 A1* | 2/2015 | Cox | .................. | H01L 21/67103 |
| | | | | 361/234 |
| 2016/0196997 A1* | 7/2016 | White | ............... | H01L 21/67718 |
| | | | | 361/234 |

* cited by examiner

TRI-MODAL CARRIER FOR A SEMICONDUCTIVE WAFER

The current application claims a priority to the U.S. Provisional Patent application Ser. No. 61/902,591 filed on Nov. 11, 2013.

FIELD OF THE INVENTION

The present invention relates generally to a substrate carrier. More specifically, the present invention is a mobile carrier that uses a multiple force combination for clamping thin wafers or similar substrates.

BACKGROUND OF THE INVENTION

Thin semiconductive substrates in the form of coupons or wafers are difficult to handle in a manufacturing environment, which can cause damages and yield loss during the de-bonding process. With emergence of three-dimensional integrated circuits, through-silicon vias, micro-electro-mechanical technologies, large integrated device manufacturers and foundries are struggling with handling the ductile nature of these thin substrates, which are exposed to harsh environments during wafer fabrication processes. Typical fabrication processes include, but is not limited to, high shear force, vacuum, plasma, thin film deposition, and full immersion.

Therefore, the objective of the present invention is to provide an electrostatic temporary bond carriers gently release thin substrates and do not require extra clean steps. The present invention is an electrostatic temporary bond technology that provides a rigid contamination-free handling solution for fragile non-standard substrates and small devices without the need for fasteners or adhesives. In addition, the present invention is able to carry these thin substrates without permanent connections to an external power supply, vacuum supply, or mechanical clamping assembly. The present invention is able to bond so strongly to a thin substrate that the present invention can hold onto the thin substrate during different manufacturing processes with large sheer forces such as grinding.

DETAILED DESCRIPTION OF THE INVENTION

All illustrations of the drawings are for the purpose of describing selected versions of the present invention and are not intended to limit the scope of the present invention.

Figure 1:
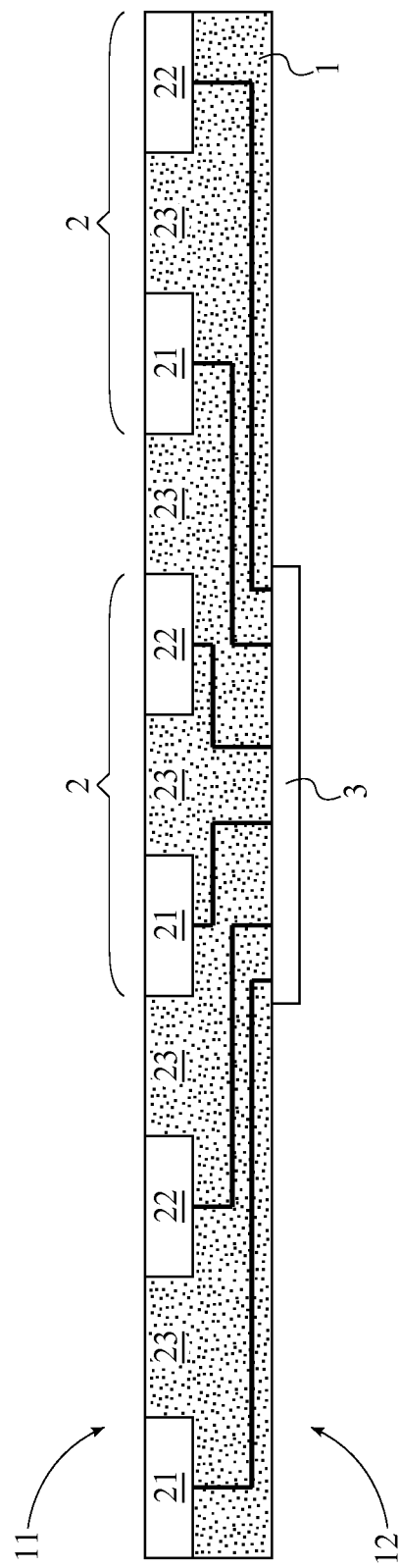
FIG. 1 is a schematic view of the major components of the present invention.
Figure 4:
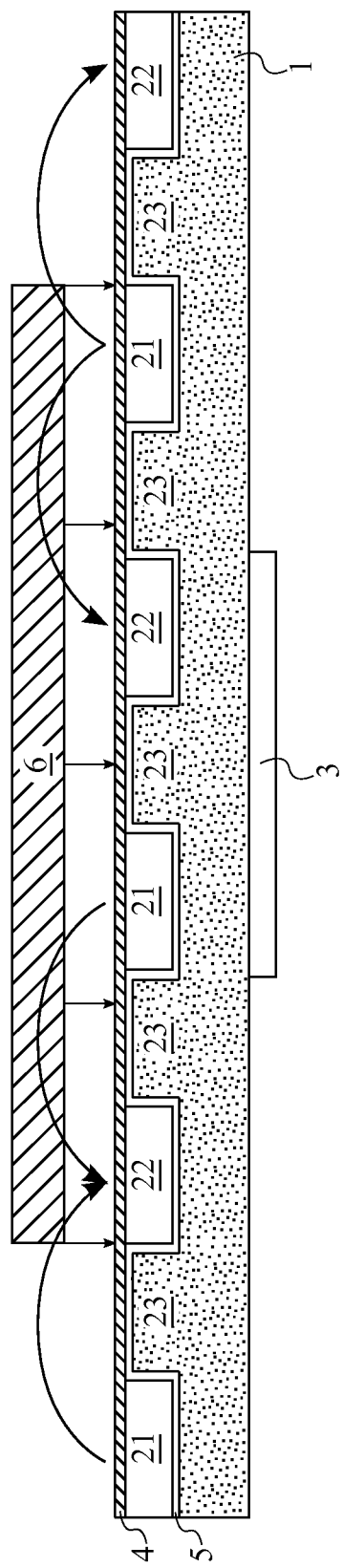
FIG. 4 is a schematic view of the present invention implementing an electrostatic field to bond a semiconductive wafer to the present invention.
Figure 5:
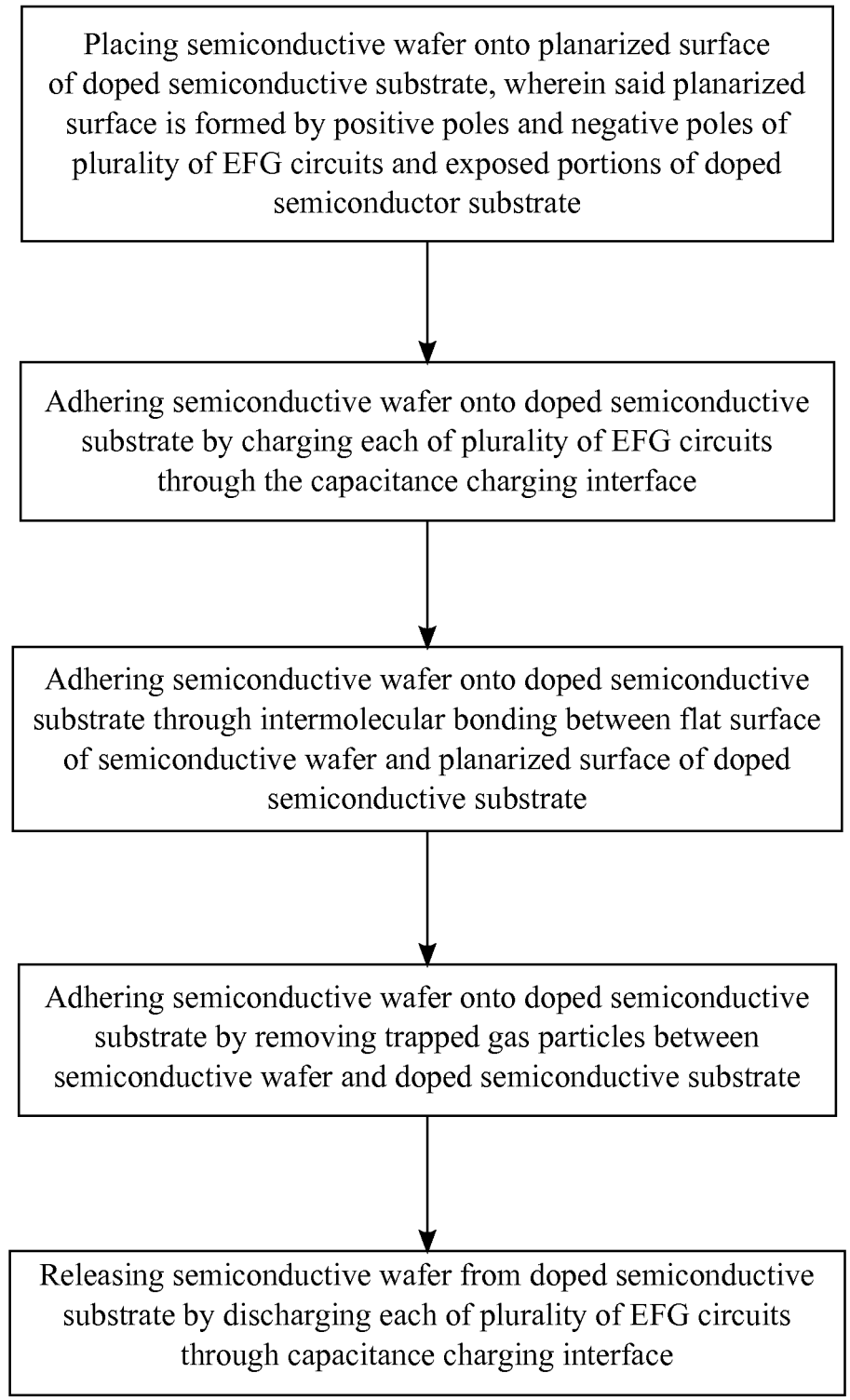
FIG. 5 is a flowchart illustrating how three modes of adhesion are used to bond the semiconductive wafer to the present invention.

As can be seen in FIGS. 1 and 4, the present invention is a tri-modal carrier that is used to handle and transport semiconductive wafers or coupons because of the thin, flimsy nature of these wafers or coupons. Three different modes of adhesion are used to hold a semiconductive wafer upon the present invention, which outlined in FIG. 5. In addition, the present invention can be used to bond and carry many different sizes of semiconductive wafers or coupons. The tri-modal carrier comprises a doped semiconductive substrate 1, a plurality of electrostatic field generating (EFG) circuits 2, and a capacitance charging interface 3. The doped semiconductive substrate 1 is used as a base to connect the other components of the present invention together and allows for a semiconductive wafer 6 to be properly situated upon the present invention. The doped semiconductive substrate 1 is either made of a p-type semiconductor material or an n-type semiconductor material that is used in combination with the plurality of EFG circuits 2 in order to generate a non-uniform electrostatic field, which is used to bond the semiconductive wafer 6 to the present invention. The plurality of EFG circuits 2 is distributed across the doped semiconductive substrate 1 so that a semiconductive wafer 6 can be adhered anywhere across the doped semiconductive substrate 1. The capacitance charging interface 3 is used to selectively charge or discharge the doped semiconductive substrate 1 and the plurality of EFG circuits 2. Essentially, the capacitance charging interface 3 is used to turn on or to turn off the non-uniform electrostatic field.

One mode of adhesion implemented by the present invention is the non-uniform electrostatic field that is generated by the plurality of EFG circuits 2. Each of the plurality of EFG circuits 2 comprises a positive pole 21, a negative pole 22, and a biased pole 23. The positive pole 21 and the negative pole 22 are antennas that are respectively provided with a positive charge and a negative charge, which generates an electrostatic field from the positive pole 21 to the negative pole 22. These antennas are designed to be highly resistive so that each antenna is able to hold a larger charge and, thus, is able to increase the capacitance between the positive pole 21 and the negative pole 22. The electrostatic field generated by each of the plurality of EFG circuits 2 will be used to hold a semiconductive wafer 6 on the doped semiconductive substrate 1. For the present invention, the plurality of EFG circuits 2 will apply a greater bonding energy on materials with a lower resistivity. Conceptually, materials with a lower resistivity have more impurities, and the electrostatic field lines emanating from the plurality of EFG circuits 2 can more easily grasp onto these impurities. For example, semiconductive materials such as aluminum have a relatively large amount of impurities, and, thus, the plurality of EFG circuits 2 can more easily bond with aluminum. However, pure materials such as quartz, sapphire, or diamond have a relatively small amount of impurities, and, thus, the plurality of EFG circuits 2 cannot easily bond to these pure materials.

When a semiconductive wafer 6 is being held by the present invention, the semiconductive wafer 6 is situated upon a first face 11 of the doped semiconductive substrate 1. Consequently, the positive pole 21 and the negative pole 22 are embedded in the doped semiconductive substrate 1 from the first face 11 so that the electrostatic field produced by the positive pole 21 and the negative pole 22 can interact with the semiconductive wafer 6. The positive pole 21 and the negative pole 22 are offset from each other across the first face 11 by a specified gap, which spans across an exposed portion of the doped semiconductive substrate 1. The exposed portion is used as the biased pole 23 for each of the plurality of EFG circuits 2. Moreover, the bonding strength of the electrostatic field is proportionately dependent on the capacitance between the positive pole 21 and the negative pole 22. The present invention can increase the capacitance between the positive pole 21 and the negative pole 22 by using the doped semiconductive substrate 1 itself and the biased pole 23, and, thus, the present invention can increase the bonding strength of the electrostatic field. When the biased pole 23 is either positively or negatively charged by the capacitance charging interface 3, the doped semiconductor substrate produces an enrichment or depletion zone within the semiconductive wafer 6, each of which is located adjacent to the biased pole 23 and is located in between the positive pole 21 and the negative pole 22. The location of the enrichment or depletion zone allows the present invention to adjust the capacitance between the positive pole 21 and the negative pole 22. Thus, the present invention can adjust the dielectric properties of the semiconductive wafer 6 through the creation of the enrichment or depletion zone. For example, the enrichment or depletion zone can be used to increase the dielectric constant and, in turn, increase the capacitance between the positive pole 21 and the negative pole 22. This increase in capacitance between the positive pole 21 and the negative pole 22 creates a stronger bonding force between the semiconductive wafer 6 and the present invention.

Figure 3:
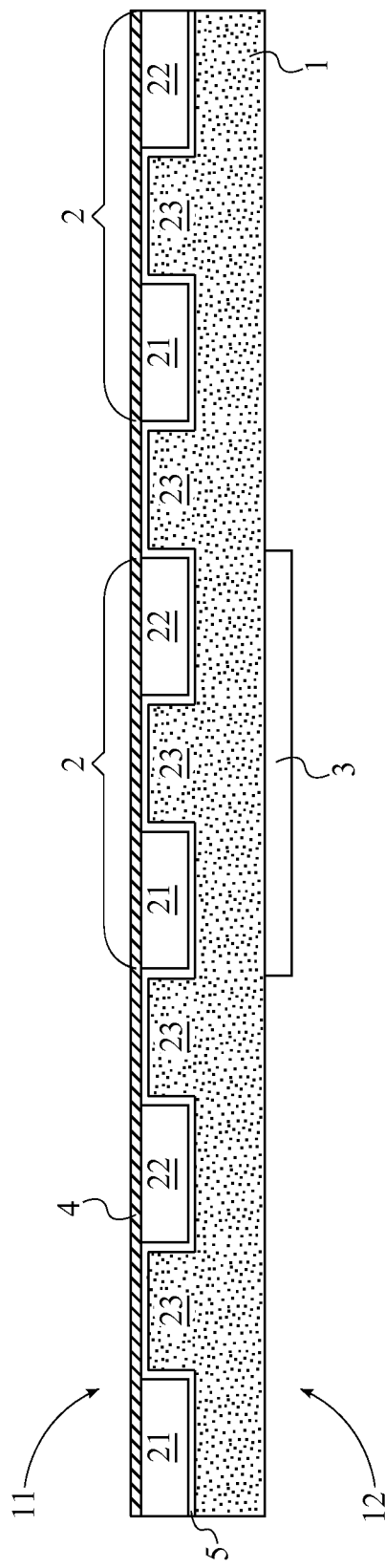
FIG. 3 is a schematic view of the present invention with the insulative film and the polishing film.

The size of the specified gap between the positive pole 21 and the negative pole 22 is determined by two factors: the size of semiconductive wafers being carried by the present invention and the operational voltage range of the present invention. The size of the semiconductive wafers determines the size of the specified gap because the present invention can grasp a smaller semiconductive wafer with a smaller specified gap between the positive pole 21 and the negative pole 22. However, a smaller specified gap would more likely cause a corona discharge between the positive pole 21 and the negative pole 22. The operational voltage range of the present invention also determines the size of the specified gap because the present invention can more securely grasp a semiconductive wafer with a higher operational voltage range. However, a higher operational voltage range would more likely cause a corona discharge between the positive pole 21 and the negative pole 22. The present invention should be designed to adequately grasp the semiconductive wafers without causing a corona discharge by selecting the appropriate size for the specified gap and by selecting the appropriate operational voltage for the present invention. Thus, the appropriate size for the specified gap and the appropriate operational voltage are also chosen to accommodate a specific size or kind of semiconductive wafer. In addition, an insulative film 5 shown in FIG. 3 is positioned between the positive pole 21 and the doped semiconductive substrate 1 and is positioned between the negative pole 22 and the doped semiconductive substrate 1, which prevents an electrical current from passing from the negative pole 22, through an exposed portion of the doped semiconductive substrate 1, and to the positive pole 21. In one embodiment of the present invention, the doped semiconductive substrate 1 is made of silicon, which is oxidized on the outer surface in order to form the insulative film 5.

A second mode of adhesion implemented by the present invention is a dipole-dipole bonding between flat surfaces of the present invention and the semiconductive wafer 6. In order to implement this mode of adhesion for the present invention, the positive poles 21 and the negative poles 22 need to be flush with the exposed portions of the doped semiconductive substrate 1. Consequently, a planarized surface is formed by the positive poles 21 and the negative poles 22 of the plurality of EFG circuits 2 and the exposed portions of the doped semiconductive substrate 1. This kind of intermolecular bonding needs to occur between the planarized surface of the doped semiconductive substrate 1 and a flat surface of the semiconductive wafer 6. In addition, a polishing film 4 shown in FIG. 3 is superimposed upon the planarized surface in order to enhance the dipole-dipole bonding between the present invention and the semiconductive wafer 6. The polishing film 4 is also used as an insulator that further prevents corona discharge from the positive pole 21 to the negative pole 22.

A third mode of adhesion implemented by the present invention is to removing trapped gas particles between the semiconductive wafer 6 and the doped semiconductive substrate 1 in order to form a better intermolecular bond between the planarized surface of the doped semiconductive substrate 1 and a flat surface of the semiconductive wafer 6. In order to implement this mode of adhesion for the present invention, the semiconductive wafer 6 is bonded to the present invention placed into a kind of vacuum chamber. Once the vacuum chamber is activated, the trapped gas particles are exhausted from the space between the semiconductive wafer 6 and the doped semiconductive substrate 1.

Figure 2:
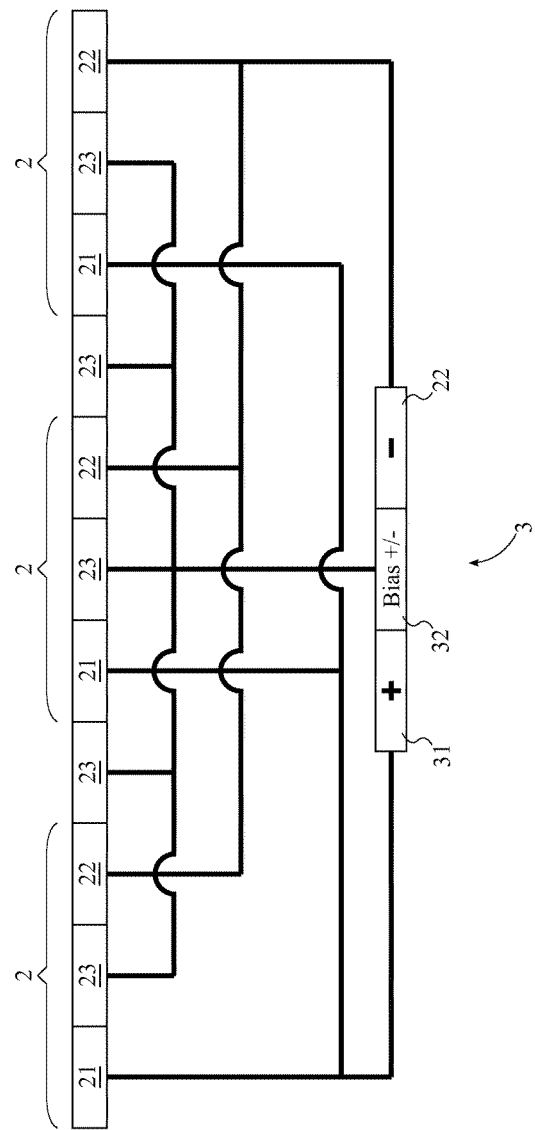
FIG. 2 is a diagram illustrating the electrical connections between the electrostatic field generating circuits and the capacitance charging interface for the present invention.

As can be seen in FIG. 2, the capacitance charging interface 3 is used to selectively charge or discharge the plurality of EFG circuits 2 by adding or depleting the positive pole 21 and the negative pole 22 of their respective electrical charges. The capacitance charging interface 3 will charge the plurality of EFG circuits 2 if the semiconductive wafer 6 needs to be bonded to the present invention. The capacitance charging interface 3 will also discharge the plurality of EFG circuits 2 if the semiconductive wafer 6 needs to be released from the present invention. The capacitance charging interface 3 comprises at least one positive terminal 31, at least one negative terminal 32, and at least one biasing terminal 32, all of which are mounted onto a second face 12 of the doped semiconductive substrate 1. This allows a temporary electrical connection to be made with the capacitance charging interface 3 from the bottom of the present invention while the semiconductive wafer 6 is held on the top of the present invention. The at least one positive terminal 31 is electrically connected to the positive poles 21 of the plurality of EFG circuits 2 so that electrical current can flow from the positive poles 21 to the capacitance charging interface 3 while charging the plurality of EFG circuits 2 and can flow from the capacitance charging interface 3 to the positive poles 21 while discharging the plurality of EFG circuits 2. Similarly, the at least one negative terminal 32 is electrically connected to the negative poles 22 of the plurality of EFG circuits 2 so that electrical current can flow from the capacitance charging interface 3 to the negative poles 22 while charging the plurality of EFG circuits 2 and can flow from the negative poles 22 to the capacitance charging interface 3 while discharging the plurality of EFG circuits 2. In addition, the at least one biasing terminal 32 is electrically connected to the biased pole 23 in order to allow electrical current to flow through the doped semiconductive substrate 1. In the preferred embodiment of the present invention, the at least one positive terminal 31, at least one negative terminal 32, and at least one biasing terminal 32 are mounted onto the second surface 12 of the doped semiconductive substrate 1 so that the capacitance charging interface 3 does not interfere with the positioning of the semiconductive wafer 6 on the first face 11 of the doped semiconductive substrate 1.

Although the invention has been explained in relation to its preferred embodiment, it is to be understood that many other possible modifications and variations can be made without departing from the spirit and scope of the invention as hereinafter claimed.

What is claimed is:

1. A tri-modal carrier for a semiconductive wafer comprises:
    a doped semiconductive substrate;
    a plurality of electrostatic field generating (EFG) circuits;
    a capacitance charging interface;
    said semiconductive substrate comprises a first face and a second face;
    each of said plurality of EFG circuits comprises a positive pole, a negative pole, and a biased pole;
    said plurality of EFG circuits being distributed across said doped semiconductive substrate;
    said positive pole and said negative pole being embedded into said doped semiconductive substrate from said first face;
    said positive pole and said negative pole being offset from each other across said first face;
    an exposed portion of said doped semiconductive substrate being located between said positive pole and said negative pole for each of said plurality of EFG circuits;
    said biased pole being said exposed portion of said doped semiconductive substrate; and
    said capacitance charging interface being electrically connected to said positive pole, said negative pole, and said biased pole.

2. The tri-modal carrier for a semiconductive wafer as claimed in claim 1 comprises:
    said capacitance charging interface comprises at least one positive terminal;
    said at least one positive terminal being electrically connected to said positive poles of said plurality of EFG circuits; and
    said at least one positive terminal being mounted onto said second face.

3. The tri-modal carrier for a semiconductive wafer as claimed in claim 1 comprises:
    said capacitance charging interface comprises at least one negative terminal;
    said at least one negative terminal being electrically connected to said negative poles from said plurality of EFG circuits; and
    said at least one negative terminal being mounted onto said second face.

4. The tri-modal carrier for a semiconductive wafer as claimed in claim 1 comprises:
    said capacitance charging interface comprises at least one biasing terminal;
    said at least one biasing terminal being electrically connected to said biased poles from said plurality of EFG circuits; and
    said at least one biasing terminal being mounted onto said second face.

5. The tri-modal carrier for a semiconductive wafer as claimed in claim 1 comprises:
    said positive pole and said negative pole being flush with said exposed portions of said doped semiconductor substrate; and
    a planarized surface being formed by said positive poles and said negative poles of said plurality of EFG circuits and said exposed portions of said doped semiconductor substrate.

6. The tri-modal carrier for a semiconductive wafer as claimed in claim 5 comprises:
    a polishing film; and
    said polishing film being superimposed upon said planarized surface.

7. The tri-modal carrier for a semiconductive wafer as claimed in claim 1 comprises:
    an insulative film; and
    said insulative film being positioned between said positive pole and said doped semiconductive substrate.

8. The tri-modal carrier for a semiconductive wafer as claimed in claim 1 comprises:
    an insulative film; and
    said insulative film being positioned between said negative pole and said doped semiconductive substrate.

9. The tri-modal carrier for a semiconductive wafer as claimed in claim 1, where said doped semiconductive substrate is made of a p-type semiconductor material.

10. The tri-modal carrier for a semiconductive wafer as claimed in claim 1, where said doped semiconductive substrate is made of an n-type semiconductor material.

* * * * *